United States Patent [19]
Parfitt

[11] Patent Number: 5,602,516
[45] Date of Patent: Feb. 11, 1997

[54] ASYMMETRICAL NOTCH FILTER

[76] Inventor: Dale R. Parfitt, 6869 Bayshore Dr., Lantana, Fla. 33462

[21] Appl. No.: 543,415

[22] Filed: Oct. 16, 1995

[51] Int. Cl.$^6$ ............................................. H03H 7/01
[52] U.S. Cl. ............................................. 333/176; 333/202
[58] Field of Search ................................. 333/175, 176, 333/202

[56] References Cited

U.S. PATENT DOCUMENTS

| | | | |
|---|---|---|---|
| 4,186,359 | 1/1980 | Kaegebein | 333/134 |
| 4,449,108 | 5/1984 | Endo et al. | 333/202 |
| 4,586,007 | 4/1986 | Ciszek | 333/175 |
| 4,901,043 | 2/1990 | Palinkas | 333/176 X |
| 5,032,807 | 7/1991 | Petrovic | 333/176 |
| 5,202,656 | 4/1993 | Clark et al. | 333/176 X |

*Primary Examiner*—Benny Lee
*Assistant Examiner*—Justin P. Bettendorf

[57] ABSTRACT

A dual stage filter providing a relatively deep notch whose attenuation versus frequency curve is asymmetrical. The filter consists of a helical transmission line one end of which is connected to electrical ground. The opposite end is connected to a variable piston capacitor whose remaining end is also connected to ground. The ungrounded junction of these two components is connected to an input connector through a series capacitor. An identical circuit is arranged and connected to the output connector. These two circuits are isolated from each other by a conductive partition and housing. A series inductor connects the input and output connector. A matching capacitor is connected in parallel across a portion of the series inductor.

2 Claims, 8 Drawing Sheets

ASYMMETRICAL NOTCH FILTER

BACKGROUND—FIELD OF THE INVENTION

Background of Invention

This invention relates to electronic notch filters and more particularly to VHF notch filters with a relatively sharp transition between the notch frequency and the pass frequencies and an asymmetrical frequency vs. attenuation curve.

BACKGROUND—DESCRIPTION OF PRIOR ART

It is well known that the front end amplifying stages of receivers are limited in the strength of signal(s) they can linearly amplify before distortion begins to occur. This distortion is typically called intermodulation or cross modulation distortion. The most common method to diminish intermodulation is to limit the band of frequencies that are "seen" by the receiving amplifier. Bandpass filter topology has historically been the filter of choice. Either the filter has a bandwidth sufficient to pass the frequencies of interest or more expensive and complex tracking bandpass filters may be employed. In this filter, the passband is considerably narrower than the spectrum to be received, but the filter is electronically or manually tuned along with the receiver so that the bandpass filter's center frequency is the same as the frequency of the receiver.

The 2 meter amateur band (144–148 megaHertz) suffers from a unique form of intermodulation. Pager transmitters are assigned to multiple channels in the 152–153 megaHertz region and 157–159 megaHertz region. They typically run high power (300–350 watts) and transmit at a high duty cycle (time on the air/time off the air). This makes them a primary candidate to cause intermodulation in susceptable receivers. If, in the general third order intermodulation formula ($F_{im}=F_1\pm F_2\pm F_3$) $F_1$ and $F_2$ are chosen as pagers in the 152–153 region and $F_3$ is chosen to be a pager channel in the 157–159 region, the sum of $F_1$ and $F_2$ minus $F_3$ places the intermodulation products throughout the 2 meter amateur band. The problem has gotten worse in recent years as the radio manufacturers have included general coverage VHF receive (120–174 mHz) in the transceivers. Wide-band bandpass filters have replaced the previous filters centered around 144–148 megaHertz. A few radios employ tracking front end bandpass filters but because of the necessity of small size, these filters have limited rejection capabilities of signals so close to the 2 meter band.

Solutions to this problem to date have been to add on an external bandpass filter. These vary from large quarter wave cavities (typically 19" tall×5" diameter)) that need to be tuned if the receive/transmit frequency is changed appreciably to large multiple cavity reentrant bandpass filters (Sinclabs Ontario Canada). These filters typically cost several hundred dollars or more.

Another solution is a smaller bandpass filter distributed by Tucker Electronics of Dallas, Tex. This filter, in order to achieve sufficient selectivity has appreciable insertion loss necessitating that it be switched out during transmission. This is accomplished by applying +12 volts to a bypass relay during transmit.

In addition to the above mentioned problems, all of these approaches severly limit the range of frequencies that can be received when the filter is connected. The receiver equipped for general coverage VHF receive is now limited to 144–148 megaHertz or less. Another problem is encountered when these filters are used on dual band radios (usually 2 meter and 70 centimeter) having a single antenna connection. Because the bandpass filter by definition is very lossy at frequencies removed from its bandpass, it must be taken off the radio before the 70 centimeter portion of the radio can be used. This can be inconvenient and time consuming.

As can be seen from the forgoing, solutions to date have been of the bandpass filter type. These solutions fail to recognize that the paging transmitters are nearly the sole cause of intermod not only to the 2 meter amateur band but to VHF scanner receivers and 2 way radios operating in the 150–170 megaHertz spectrum. If a filter eliminates one or more of the terms in the intermodulation formula ($F_1,F_2$), even though $F_3$ remains, the intermodulation will disappear.

Although notch filters are known (Ciszek, U.S. Pat. No. 4,586,007 and Petrovic U.S. Pat. No. 5,032,807) and asymmetrical notch filters (Endo et. al. U.S. Pat. No. 4,449,108) none contain all of the aforementioned features along with relative simplicity of construction as will be seen. For instance, although the circuitry of the Ciszek patent may at first blush seem similar, the actual operation of the circuit as will be seen, is entirely different. In the Ciszek filter the parallel tanks (36, 42) are resonated at the notch frequency and attenuation takes place as a result of phase cancellation provided by capacitor 44.

Asymmetrical notch filters generally contain a lumped or distributed reactive element in series with the input-output connection (Endo et al U.S. Pat. No. 4,449,108 Kaegebein U.S. Pat. No. 4,186,359). It is this reactance that yields the asymmetry. However, at frequencies above the notch frequency (in the instance of a series inductive element) the series reactance becomes appreciable and through loss increases with increasing frequency (see FIG. 5). Just the opposite is true with a capacitive series element (see FIG. 6). The present invention provides a simple solution to this problem for a set of frequencies well above the notch frequency. This response is desirable when the filter is used with dual band radios as will be described.

OBJECTS AND ADVANTAGES

Accordingly the filter described in this application has the following advantages over the prior art.

The filter is small compared to cavity types. The preferred embodiment measures 1"×2"×2.5". The asymmetrical nature of the notch allows a very sharp transition from the notch frequency to the pass frequency with relatively uncomplicated circuitry. Typically, a notch in excess of 45 decibels is achieved at 152.5 megaHertz (the center of the lower of the two paging spectra previously mentioned) while loss of less than 0.2 decibels is achieved throughout the 2 meter amateur band. This compares with losses of 1–6 decibels in the bandpass versions. As shown in FIG. 1 the notch rises much more slowly on the high frequency side. This is desirable in order to notch as many of the pager channels as possible. V.S.W.R. (voltage standing wave ratio) is typically less than 1.2:1 throughout the 2 meter band. Because of these favorable characteristics, there is no need to switch the filter out during transmission as is the case with some competing models. Frequencies above or below the notched spectrum are still received. This allows users of radios equipped with general coverage VHF receive to still receive all frequencies except those in the notch band. Although the loss begins to increase for frequencies well above the notch frequency, in the preferred embodiment the addition of a single capacitor (22) makes the filter transparent at 70 centimeters allowing it to be used with the aforementioned dual band radios. Finally, cost is considerably less than the previously mentioned devices.

Still further objects and advantages will become apparent from a consideration of the ensuing description and accompanying drawings.

Figure 1:
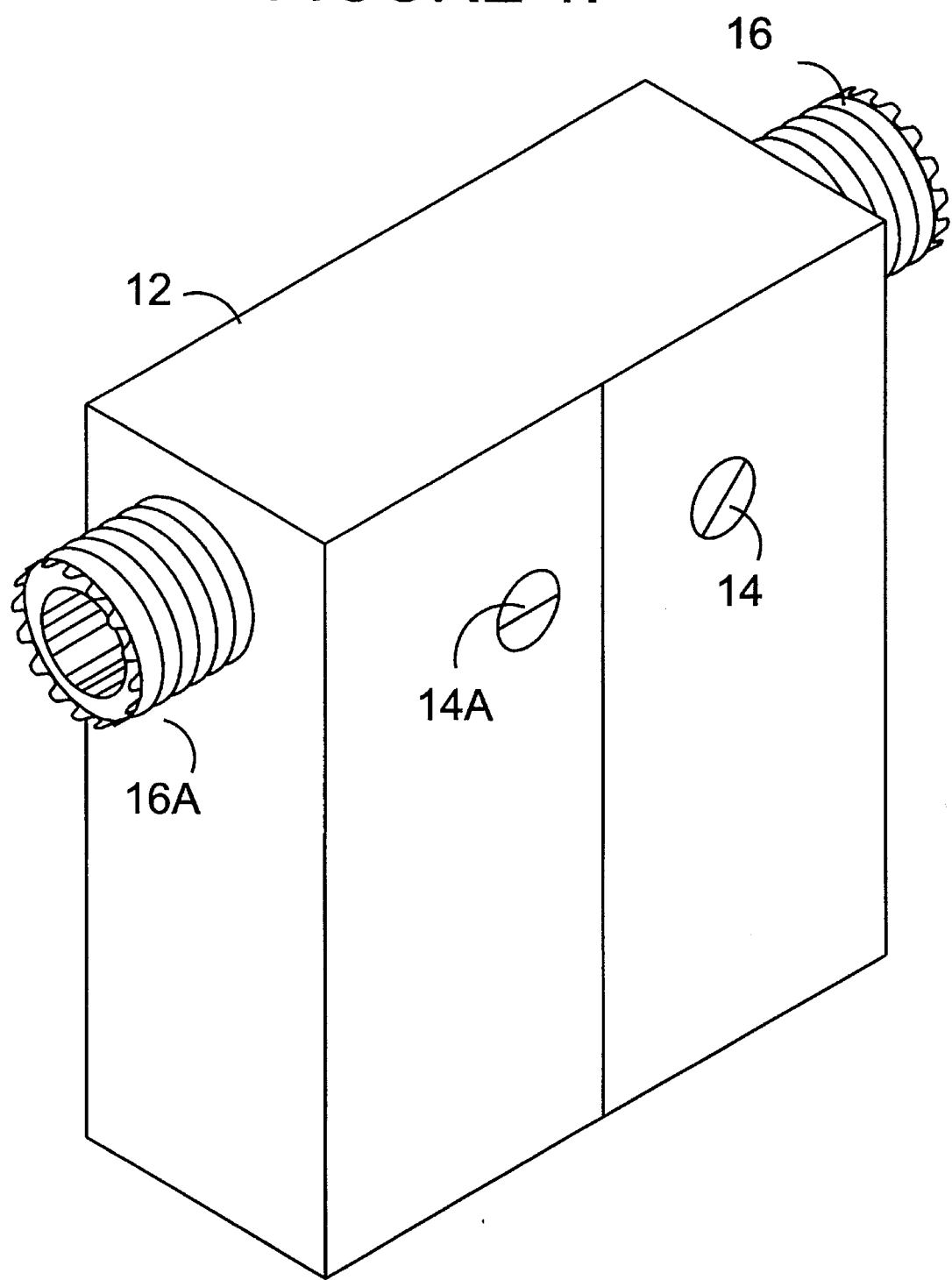
FIG. 1 is a perspective view of a filter according to my invention.

REFERENCE NUMERALS 10 helical resonator
10A helical resonator
12 housing
14 piston capacitor
14A piston capacitor
16 RF connector
16A RF connector
18 capacitor
18A capacitor
20 series inductor
22 matching capacitor
24 conductive partition
26 series capacitor

Preferred Embodiment—Description

Figure 2:
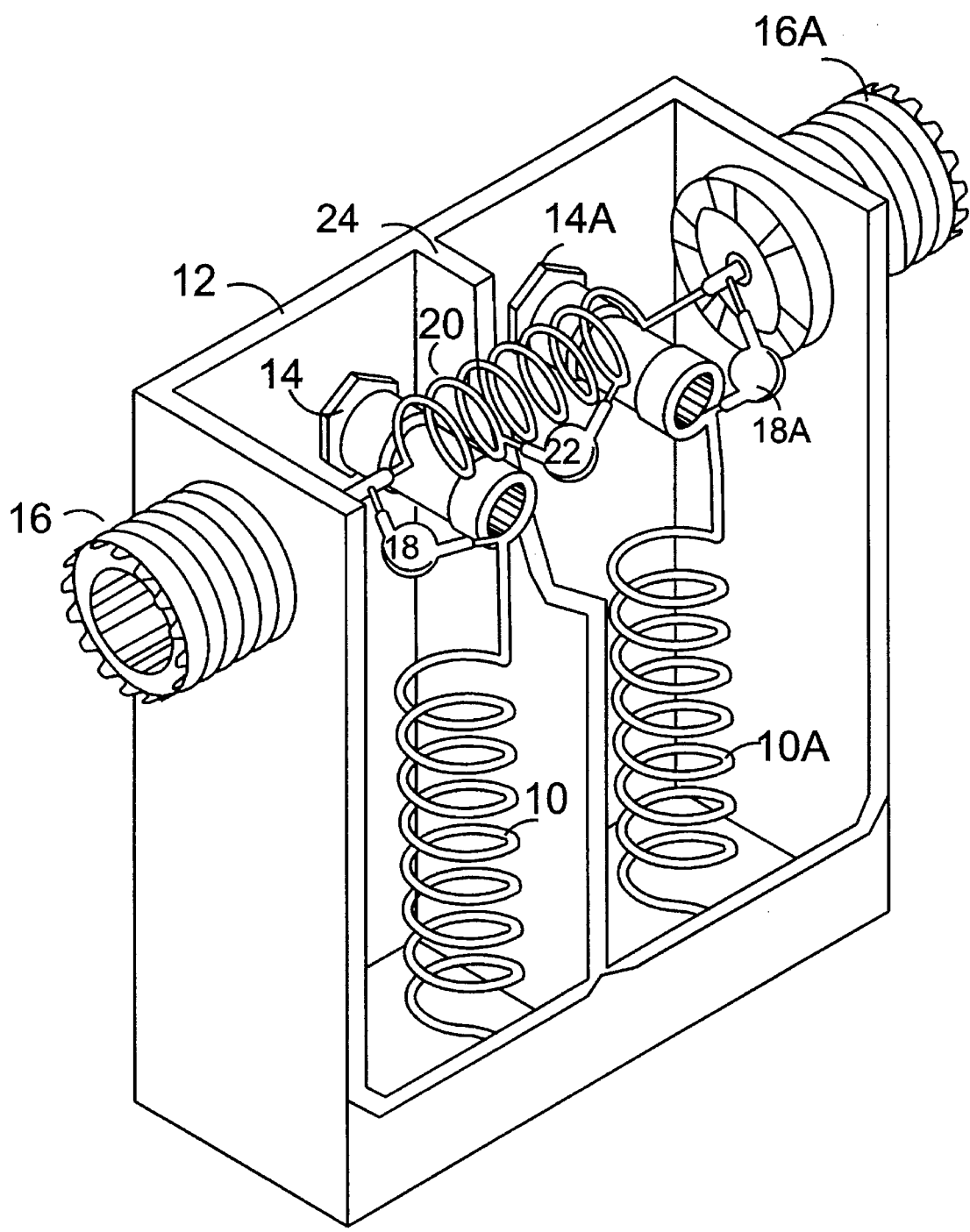
FIG. 2 is a perspective view of the invention with portions of the outer housing removed for clarity

FIG. 1, FIG. 2—Asymmetrical Notch Filter.

FIG. 1 is a perspective view of the present invention showing the RF connectors 16, 16A and the tuning adjustment portions of piston capacitors 14, 14A. FIG. 2 is a perspective view of the present invention with a portion of the housing 12 removed for clarity. The same device is shown schematically in FIG. 3A. Helical transmission line 10 has its first end connected to housing 12 which is at electrical ground. A second end of helical transmission line 10 is connected to first end of piston capacitor 14. Second end of piston capacitor 14 is electrically connected to housing 12. First end of piston capacitor 14 is joined to RF connector 16 through capacitor 18. A second circuit comprised of helical transmission line 10A, piston capacitor 14A, capacitor 18A and RF connector 16A are configured identically to their unsubscripted counterparts as shown schematically in FIG. 3A. A series inductor 20 joins RF connector 16 to a second RF connector 16A. Matching capacitor 22 is shunted across a portion of series inductor 20. Conductive partition 24 electrically isolates the two helical circuits. Typically, housing 12 is comprised of two 1"×1" sections of square brass tubing 2.5" long soldered together along common walls to form partition 12. Partition 12 has an elongated notch milled into its upper end to permit series inductor 20 to pass unobstructed from RF connector 16 to RF connector 16A. Inductor 20 is typically made up of seven turns of 18 gauge wire 0.125" in diameter and 1" long. Matching capacitor 22 is connected in parallel with the first three turns of series inductor 20.

Helical transmission line 10 and helical transmission line 10A are constructed according to the well known equations for helical transmission lines as set forth in The Handbook of Filter Synthesis by A. I. Zverev for instance. In particular, the helical transmission lines of the present invention are constructed of 7 turns of #16 gauge copper wire 0.5" in diameter and 1.0" in length. Piston capacitor 14 and piston capacitor 14A are multiturn coaxial type variable capacitors with a typical tuning range of 0.5–5 pF. They are so mounted as to allow adjustment from the exterior of housing 12. This is clearly shown in FIG. 1. A suitable type used in the present invention is manufactured by Stetnor Trush. Matching capacitor 22 is a ceramic disc capacitor having a value of 10 pF. Capacitors 18 and 18A are 3.0 pF NPO temperature stable disc capacitors.

Preferred Embodiment—Operation

Figure 3A:
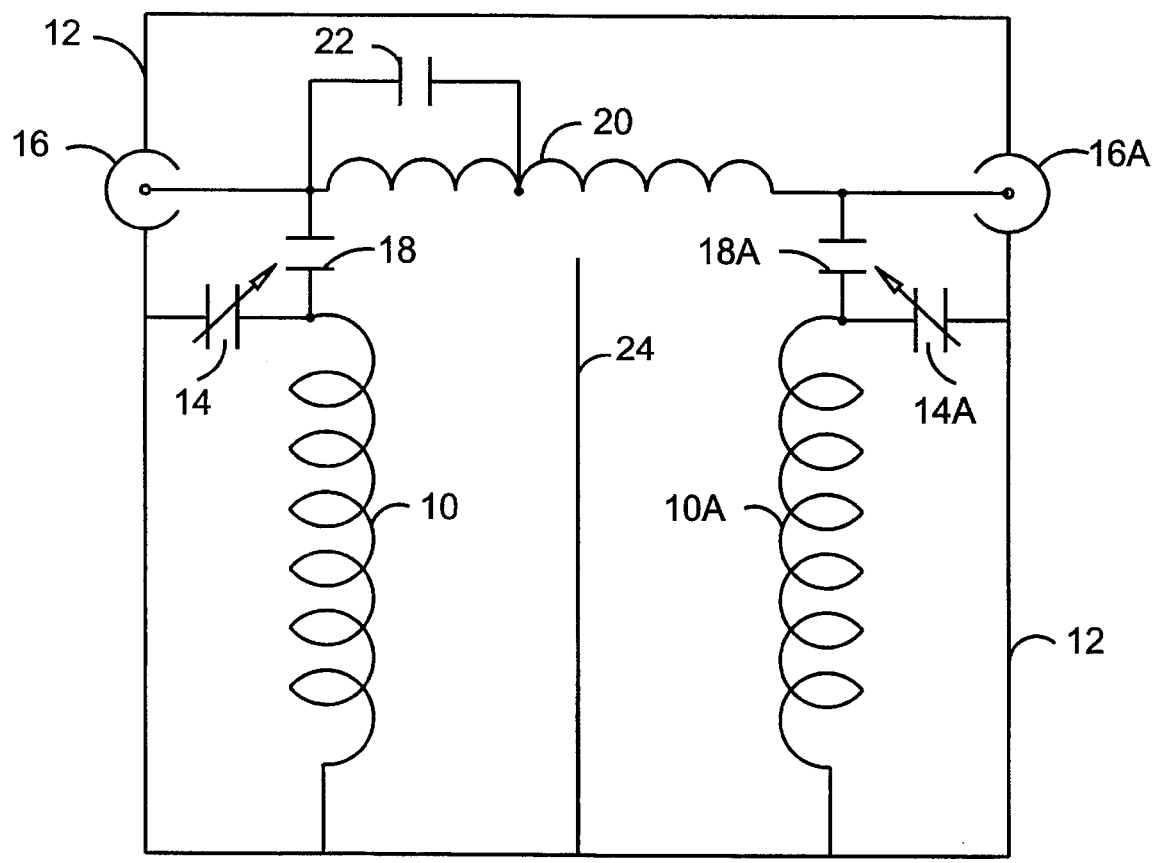
FIG. 3A is a schematic representation of the preferred embodiment
Figure 5:
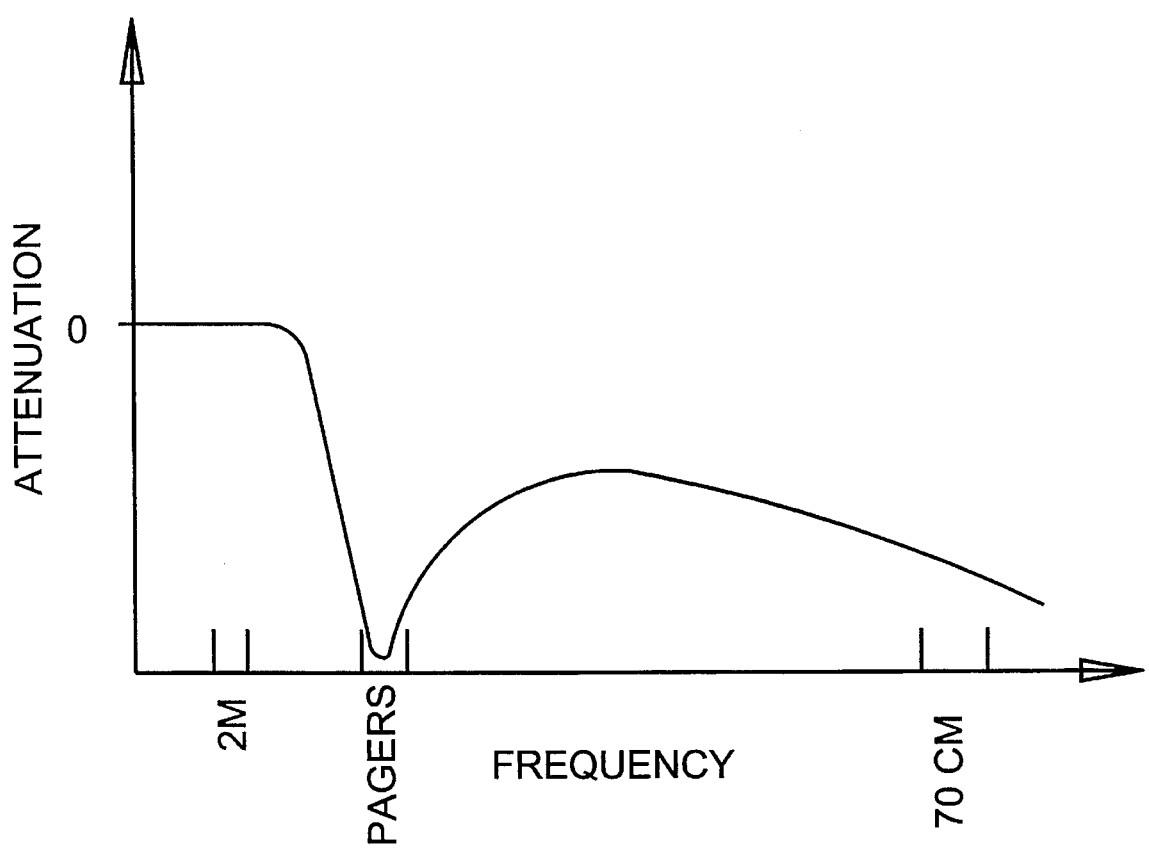
FIG. 5 is a graph of attenuation vs. frequency of the filter of FIG. 3B

Most commonly, helical transmission lines are used in their parallel resonant mode where either they are self resonant or are tuned to parallel resonance by the addition of a small variable capacitance in parallel with the helical transmission line. In the present invention helical transmission line 10 is less than a quarter wave long and therefore looks like a very high Q inductor. Piston capacitor 14 allows for small adjustments to the length of helical transmission line 10. The net result of this combination appears as an adjustable, high Q inductor one end of which is at electrical ground while the opposite end is connected in series with capacitor 18. Piston capacitor 14 is then adjusted to yield a high Q series resonant circuit at the desired notch frequency. In order to preserve the high Q nature of helical transmission line 10, the value of piston capacitor 14 is relatively small, typically less than 1 pF. Components 10A, 14A and 18A function in a manner identical to their unsubscripted counterparts. Taken separately, either of these two series resonant circuits yields a relatively wide symmetrical notch of approximately 20 dB. When connected together by series inductor 20 as shown in FIG. 3A the resultant notch is in excess of 45 dB and asymmetrical as shown in FIG. 5. When the two circuits are adjusted for a notch at 152.5 mHz. (approximately the center of the lower paging spectrum) the filter loss is less than 0.2 dB below 150 mHz. V.S.W.R. in the 2 meter amateur band is typically less than 1.2:1.

Inductor 20 causes the filter to be asymmetrical as shown in FIG. 5. This asymmetry is important in that it yields surprisingly low insertion loss and V.S.W.R. at frequencies below and close in to the notch frequency. At frequencies well above the notch frequency the reactance of series inductor 20 causes substantial V.S.W.R. and insertion loss. Because many of the amateur transceivers are dual band (2M and 70 cM) it would be desirable to have the filter be transparent at 70 cM (420–450 mHz.). The function of matching capacitor 22 is to cause the network comprised of series inductor 20 and matching capacitor 22 to be series resonant at 70 cM forming a very low impedance connection from input connector 16 to output connector 16A. At VHF frequencies, the reactance of matching capacitor 22 is sufficiently high as to be invisible. Thus at VHF frequencies the circuit appears as in FIG. 3B. The two series resonant circuits formed by 10, 14, 18 and 10A, 14A, 18A are essentially high impedances at UHF and are invisible to the 70 cM energy. The result is an insertion loss of less than 0.2 dB and a V.S.W.R. of less than 1.5:1 across the 70 cM amateur band. This response is clearly shown in FIG. 4.

Other Embodiments

Notch Filter with the asymmetry curve reversed—Description

Figure 3B:
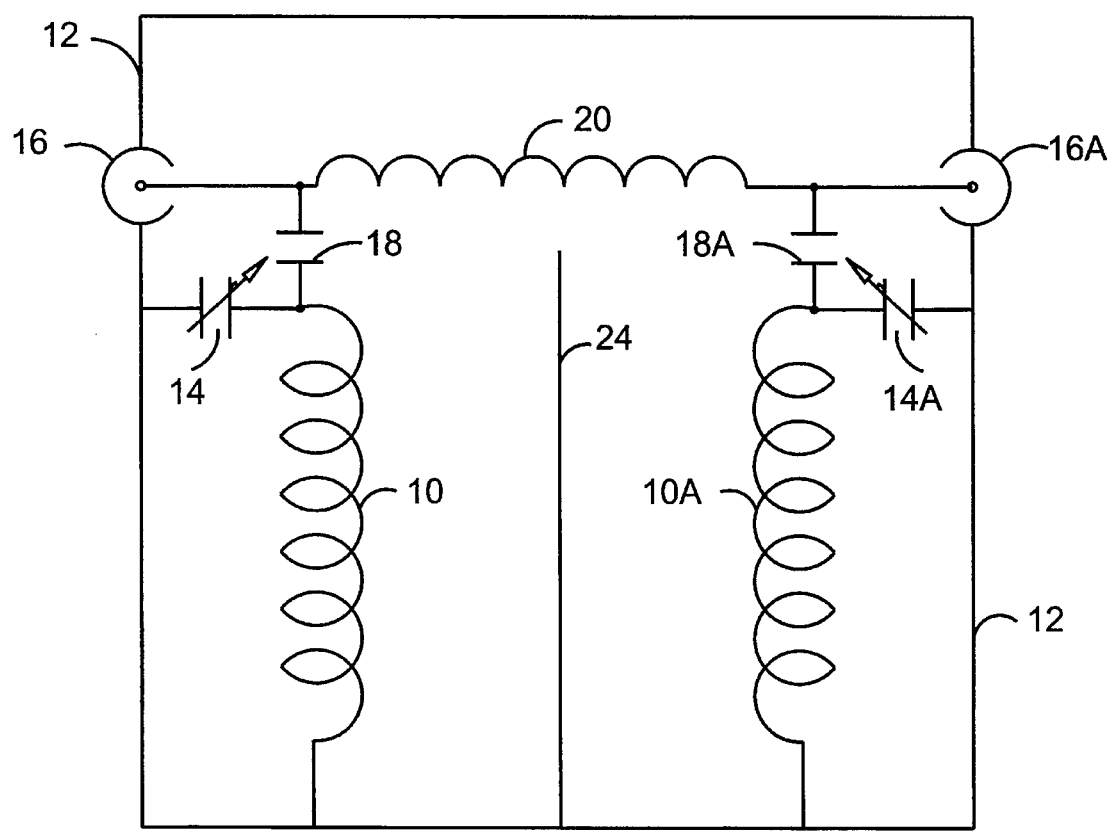
FIG. 3B is a schematic representation of another embodiment of the filter.
Figure 3C:
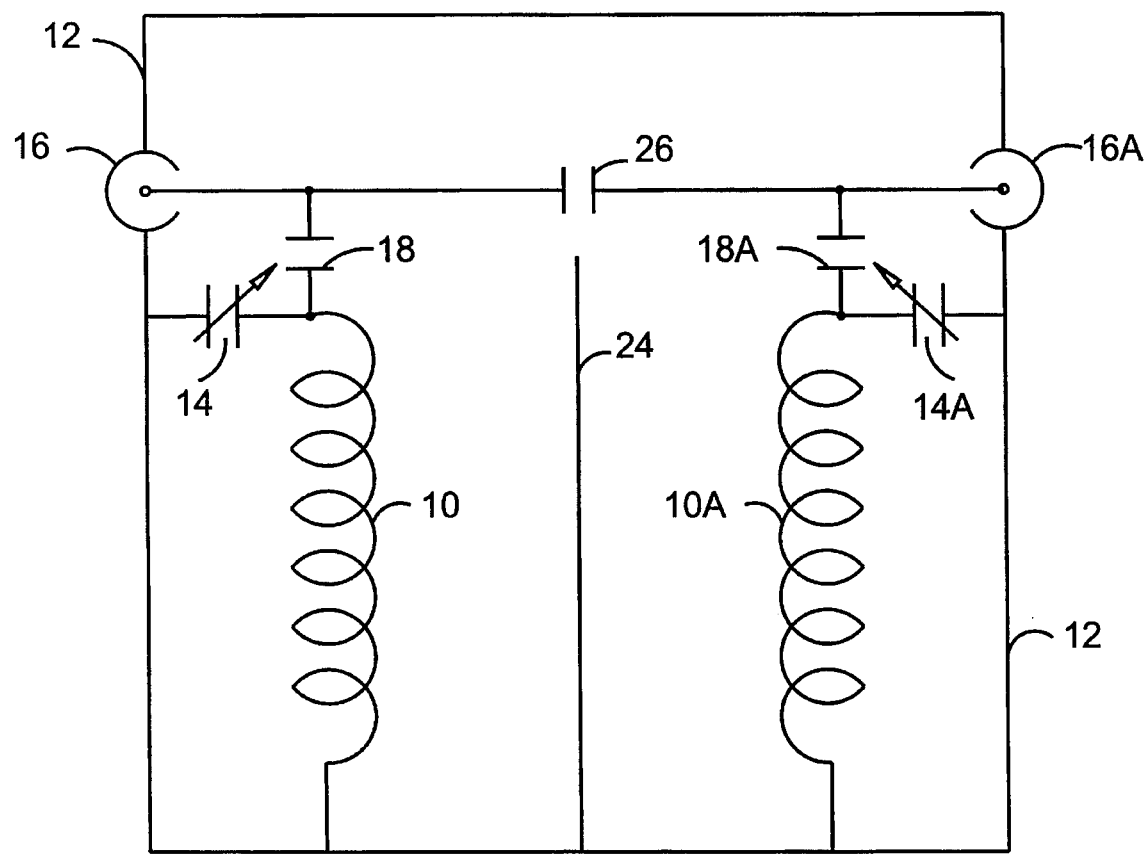
FIG. 3C is a schematic representation of a 3rd embodiment of the filter
Figure 4:
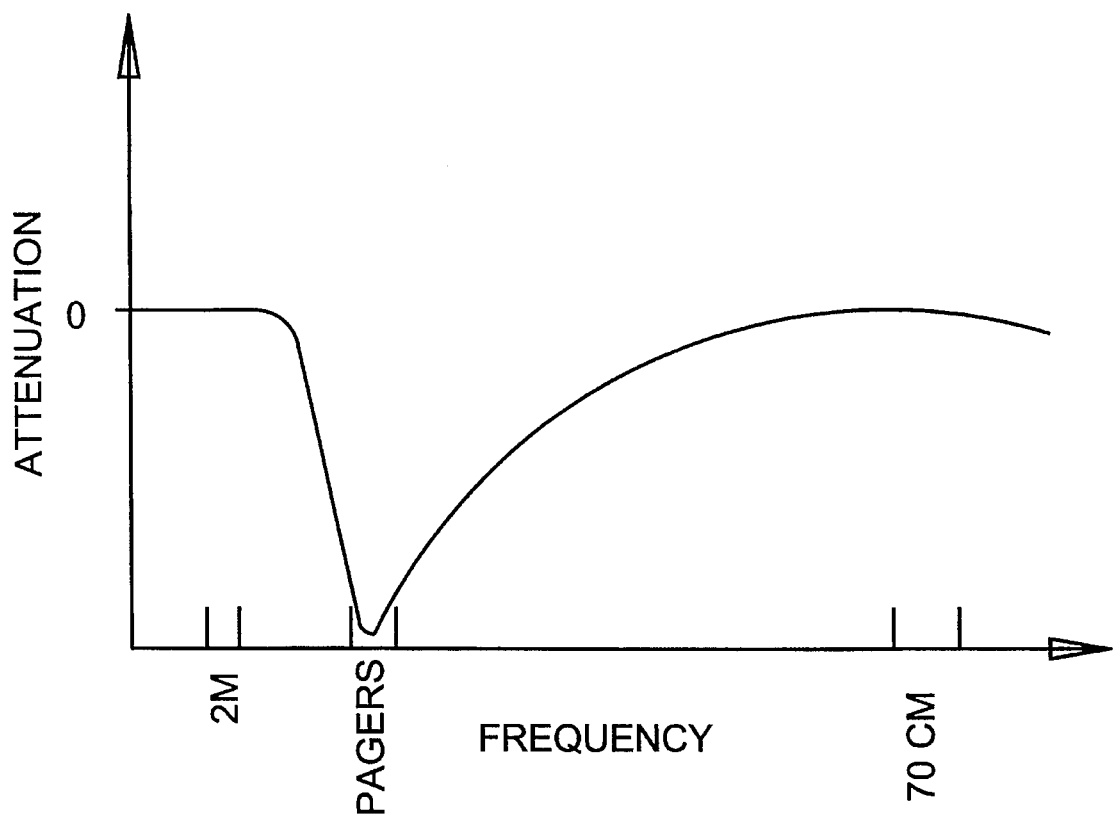
FIG. 4 is a graph of attenuation vs. frequency of the filter of FIG. 3A
Figure 6:
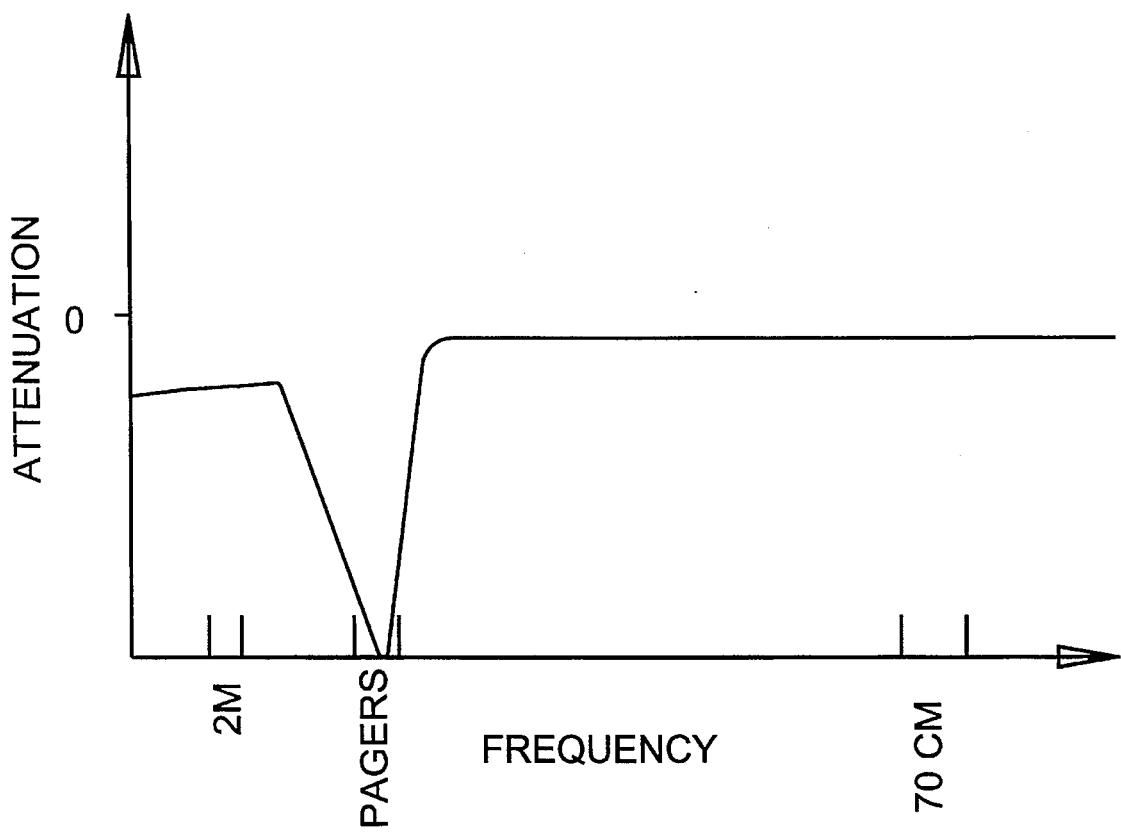
FIG. 6 is a graph of attenuation vs. frequency of the filter of FIG. 3C

If dual band operation is not required then the filter of FIG. 3B may be employed. Matching capacitor 22 is omitted. The resultant frequency versus attenuation curve is unchanged at VHF frequencies but now the filter has some loss at all frequencies above the notch frequency and would not be suitable for transmitting at these frequencies. Still, this embodiment is useful for VHF only radios that are frequently encountered in both the amateur and commercial radio markets. The altered attenuation versus frequency curve for this embodiment is shown in FIG. 3B Notch Filter For Use With Scanner Radios—Description FIG. 3C shows yet another embodiment of the present invention. Scanner radio enthusiasts are generally not interested in listening to the 2 Meter amateur band or do so with an amateur transceiver. However, the frequencies just above the pager assigned frequencies (154–174 mHz.) are heavily populated by public service radios that are of great interest to scanner enthusiasts. The shape of the filter of FIG. 3A, although usable, would not be the best solution for this application because of its appreciable loss at frequencies just above the notch frequencies. The filter embodiment of FIG. 3C yields a filter whose basic response is the mirror image of that of FIG. 3B. This is accomplished by removing series inductor 20 and substituting series capacitor 26. Typically this is a ceramic disc capacitor whose value is 18 pF. The frequency versus attenuation curve of this embodiment is shown in FIG. 6.

Conclusions, Ramifications, and Scope

Accordingly, it can be seen that I have provided a novel filter that effectively eliminates intermodulation distortion in 2 meter amateur transceivers, VHF radios, and scanner receivers. The present invention has advantages over current solutions in that it is generally smaller, is usable on dual band radios, has lower insertion loss, does not require the filter to be switched out during transmit and is more economical.

Although the description above contains many specificities, these should not be construed as limiting the scope of the invention but as merely providing illustrations of some of the presently preferred embodiments of this invention. Various other embodiments and ramifications are possible within it's scope. For example, although the filter is specified to eliminate the paging transmitters in the 152–153.5 mHz range it is adaptable to other frequencies experiencing similar problems.

Thus the scope of the invention should be determined by the appended claims and their legal equivalents, rather than by the examples given.

What is claimed is:

1. An asymmetrical notch filter comprising: a helical transmission line whose bottom end is connected to a conductive housing that is at electrical ground; and top end of said helical transmission line connected to an input terminal through a fixed capacitive means; a variable capacitor is connected in parallel with said helical transmission line; a second helical transmission line whose bottom end is connected to said conductive housing and top end connected to an output terminal through second capacitive means; a second variable capacitor is connected in parallel with said second helical transmission line; first and second helical transmission lines electrically isolated from each other by a conductive partition and said conductive housing; said input and output terminals connected by an inductor.

2. The filter of claim 1 wherein a capacitive means is connected in parallel with a portion of said inductor connecting said input and output terminals.

* * * * *